United States Patent
Han

(10) Patent No.: US 12,509,779 B2
(45) Date of Patent: Dec. 30, 2025

(54) BOWL, SUBSTRATE PROCESSING APPARATUS, AND METHOD OF MANUFACTURING

(71) Applicant: SEMES CO., LTD., Chungcheongnam-do (KR)

(72) Inventor: Sang Hu Han, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 391 days.

(21) Appl. No.: 18/302,839

(22) Filed: Apr. 19, 2023

(65) Prior Publication Data
US 2024/0209514 A1  Jun. 27, 2024

(30) Foreign Application Priority Data

Dec. 27, 2022 (KR) .................. 10-2022-0186275

(51) Int. Cl.
   *C23F 1/46*  (2006.01)
   *B29C 45/14*  (2006.01)

(52) U.S. Cl.
   CPC .............. *C23F 1/46* (2013.01); *B29C 45/14* (2013.01)

(58) Field of Classification Search
   None
   See application file for complete search history.

(56) References Cited

U.S. PATENT DOCUMENTS

| | | | |
|---|---|---|---|
| 2010/0307410 A1* | 12/2010 | Yoshino | G03F 7/162 |
| | | | 118/506 |
| 2013/0255724 A1* | 10/2013 | Noh | H01L 21/67051 |
| | | | 134/10 |
| 2024/0209514 A1* | 6/2024 | Han | H01L 21/6708 |

FOREIGN PATENT DOCUMENTS

| | | | | |
|---|---|---|---|---|
| JP | 2009190359 A | * | 8/2009 | |
| JP | 2010-283203 A | | 12/2010 | |
| KR | 10-2010-0131798 A | | 12/2010 | |
| KR | 10-2019-0077920 A | | 7/2019 | |
| KR | 20190077920 A | * | 7/2019 | ....... H01L 21/67248 |
| KR | 10-2020-0024986 A | | 3/2020 | |
| KR | 10-2020-0029248 A | | 3/2020 | |
| KR | 10-2021-0112754 A | | 9/2021 | |
| KR | 20210112754 A | * | 9/2021 | ............ H01J 37/317 |
| KR | 10-2411769 B1 | | 6/2022 | |

OTHER PUBLICATIONS

Korean Office Action issued in corresponding KR Patent Application No. 10-2022-0186275, dated Apr. 30, 2024, pp. 1-5.

* cited by examiner

*Primary Examiner* — Sylvia Macarthur
(74) *Attorney, Agent, or Firm* — Carter, DeLuca & Farrell LLP

(57) ABSTRACT

A bowl includes a body portion having a recovery hole to which a recovery line is connected, a guide portion extending upwardly from an upper portion of the body portion and then extending in a lateral direction, and a connection frame installed across the inside of the body portion and the inside of the guide portion.

20 Claims, 10 Drawing Sheets

BOWL, SUBSTRATE PROCESSING APPARATUS, AND METHOD OF MANUFACTURING

CROSS-REFERENCE TO RELATED APPLICATION(S)

This application claims benefit of priority to Korean Patent Application No. 10-2022-0186275 filed on Dec. 27, 2022 in the Korean Intellectual Property Office, the disclosure of which is incorporated herein by reference in its entirety.

BACKGROUND

The present disclosure relates to a bowl for recovering a liquid discharged to a substrate, a substrate processing apparatus, and a method of manufacturing the bowl.

In general, various liquids are used to remove or clean a film formed on a substrate. Such liquids are provided to a rotating substrate, and the liquids provided to the substrate are recovered by a bowl disposed on one side of the substrate. Thereafter, the liquids are discharged to the outside through a pipe connected to a bowl.

The bowl is assembled by a plurality of parts as an assembly. When the liquids are at high temperature, the parts may be deformed, such that an assembly portion between the parts may deviate from an original position thereof, causing an assembly defect.

(Patent Document 1) Republic of Korea Patent Publication No. 10-2021-0112754

SUMMARY

Aspects of the present disclosure provide a bowl, a substrate processing apparatus, and a method of manufacturing the bowl, preventing the bowl from being thermally deformed.

According to an aspect of the present disclosure, there is provided a bowl including a body portion having a recovery hole to which a recovery line is connected, a guide portion extending upwardly from an upper portion of the body portion and then extending in a lateral direction, and a connection frame installed across the inside of the body portion and the inside of the guide portion.

The connection frame may include a plurality of first portions disposed across the body portion and the guide portion, the plurality of first portions disposed to be spaced apart from each other, and a plurality of second portions connecting the plurality of first portions to each other. A portion of the plurality of second portions may be disposed in the body portion, and a remaining portion of the plurality of second portions may be disposed in the guide portion.

A portion of the plurality of second portions may connect one ends of the plurality of first portions to each other, and a remaining portion of the plurality of second portions may connect the other ends of the plurality of first portions to each other.

A plurality of exhaust holes may be formed in the body portion to be spaced apart from each other, and the first portion may be disposed between the plurality of exhaust holes.

The connection frame may have a pipe structure in which a refrigerant flows.

The connection frame may have one end connected to a refrigerant supply pipe and the other end connected to a refrigerant recovery pipe.

The body portion and the guide portion may be integrally formed.

According to a second example embodiment of the present disclosure, the guide portion may have an extension protruding inwardly to be thicker than the body portion.

According to a third example embodiment of the present disclosure, a ring-shaped reinforcing member may be installed on an inner circumferential surface of the guide portion.

According to another aspect of the present disclosure, there is provided a substrate processing apparatus including a process chamber, a processing container installed within the process chamber, the processing container having a processing space for processing a substrate, a support unit supporting the substrate in the processing space, and a nozzle unit discharging a liquid to the substrate. The processing container may include a plurality of bowls disposed on a circumference of the support unit. The bowl may include a body portion having a cylindrical structure, the body portion having a recovery hole to which a recovery line is connected, a guide portion extending upwardly from an upper portion of the body portion and then extending in a lateral direction, and a connection frame installed across the inside of the body portion and the inside of the guide portion.

The connection frame may have a pipe structure in which a refrigerant flows. The connection frame may have one end connected to a refrigerant supply pipe and the other end connected to a refrigerant recovery pipe. The refrigerant supply pipe and the refrigerant recovery pipe may be connected to each other by a circulation pump. A heat exchanger may be installed in the refrigerant supply pipe.

The body portion and the guide portion may be integrally formed.

According to another aspect of the present disclosure, there is provided a method of manufacturing a bowl, the method including a mold preparing operation of preparing a mold formed such that a first space and a second space, respectively corresponding to a body portion and a guide portion connected to one end of the body portion, are connected to each other, a frame disposing operation of disposing a connection frame across the first space and the second space, and a bowl injection molding operation of injecting a molten material into the first space and the second space and integrally molding the body portion and the guide portion while fixing the body portion and the guide portion to the connection frame.

In the frame disposing operation, each of the plurality of first portions of the connection frame may be disposed across the first space and the second space. A portion of the plurality of second portions of the connection frame, connecting the plurality of first portions to each other, may be disposed in the first space, and a remaining portion of the plurality of second portion may be disposed in the second space. The first portion and the second portion may be disposed to be alternately connected to each other.

In the frame disposing operation, a pipe in which a refrigerant is flowable may be used as the connection frame.

According to the present disclosure, a body portion and a guide portion of a bowl may be fixed by an embedded connection frame, thereby preventing the guide portion from being thermally deformed by a high-temperature liquid to prevent the guide portion from being separated from the body portion.

In addition, the body portion and the guide portion may be integrally formed, thereby preventing the body portion and the guide portion from being thermally deformed.

In addition, a connection frame may have a pipe structure in which a refrigerant flows to cool the body portion and the guide portion, thereby preventing the body portion and the guide portion from being thermally deformed.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
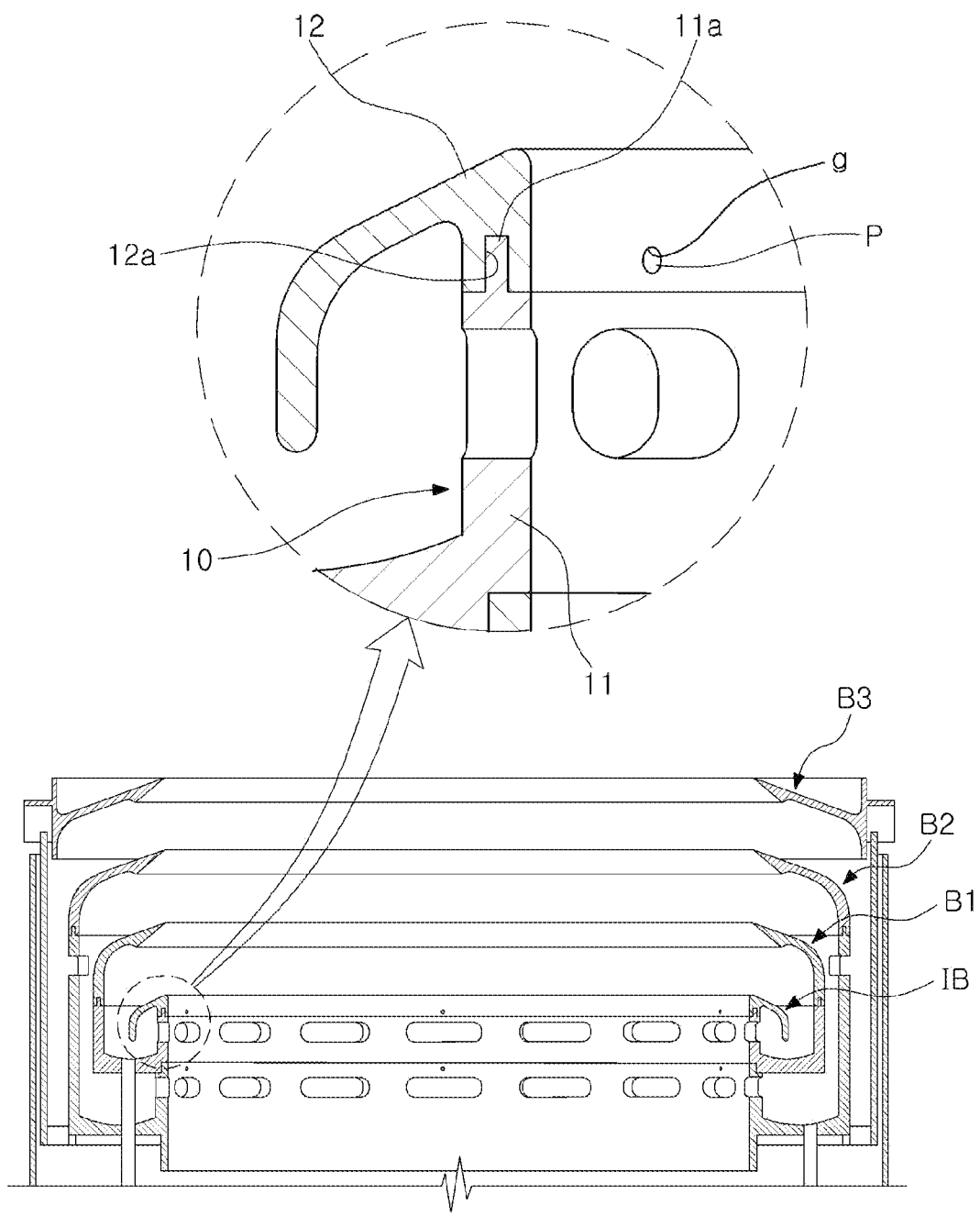
FIG. 1 is a diagram illustrating a bowl according to the related art.

Hereinafter, preferred example embodiments will be described in detail, such that the disclosure could be easily carried out. In describing example embodiments of the present disclosure, when it is determined that a detailed description of a known technology related to the present disclosure may unnecessarily obscure the gist of the present disclosure, the detailed description thereof will be omitted. In addition, the same reference numerals are used throughout the drawings with respect to components having similar functions and actions. In addition, in the present specification, terms such as "upper," "upper portion," "upper surface," "lower," "lower portion," "lower surface," and "side surface" are based on the drawings, may vary depending on a direction in which an element or component is actually arranged.

When it is mentioned that one component is "connected" or "accessed" to another component, it may be understood that the one component is directly connected or accessed to another component or that still other component is interposed between the two components. In addition, it should be noted that if it is described in the specification that one component is "directly connected" or "directly joined" to another component, still other component may not be present therebetween. In addition, it will be understood that "comprises" and/or "comprising" specify the presence of stated features, integers, steps, operations, elements, components or a combination thereof, but do not preclude the presence or addition of one or more other features, integers, steps, operations, elements, components, and/or groups thereof.

FIG. 1 is a diagram illustrating a bowl according to the related art.

Referring to the drawings, a plurality of bowls 10 according to the prior art may be disposed on a circumference of a support unit supporting a substrate to be spaced apart from each other. In the plurality of bowls 10, a first bowl B1, a second bowl B2, and a third bowl B3 may be sequentially disposed in multiple stages from the support unit to the outside. In this case, the bowl 10 may be one of the first bowl B1, the second bowl B2, and the third bowl B3, or an inner bowl IB formed on the inside of the first bowl B1.

The bowl 10 may be formed by assembling a plurality of parts.

As a specific example, when the bowl 10 is the inner bowl IB, the bowl 10 may include a body portion 11 as a lower portion and a guide portion 12 as an upper portion. Here, an assembly protrusion line 11a may be formed on an upper surface of the body portion 11 and an assembly groove line 12a may be formed on a lower surface of the guide portion 12, such that the assembly protrusion line 11a of the body portion 11 may be inserted into the assembly groove line 12a of the guide portion 12 to assemble the body portion 11 and the guide portion 12. In addition, a pin hole g may be formed in each of the body portion 11 and the guide portion 12, and a fixing pin p may be inserted into the pin hole g, such that the body portion 11 and the guide portion 12 may be fixed in an assembled state.

However, when a high-temperature liquid such as a high-temperature sulfuric acid hydrogen peroxide mixture (SPM) is discharged to the substrate and recovered by the bowl 10, the bowl 10 may be thermally deformed. Specifically, when the guide portion 12 of the bowl 10 is thermally deformed inwardly by the high-temperature liquid, the fixing pin p may be damaged or missing, such that the assembly groove line 12a may be separated from the assembly protrusion line 11a, resulting in a process defect.

Figure 2:
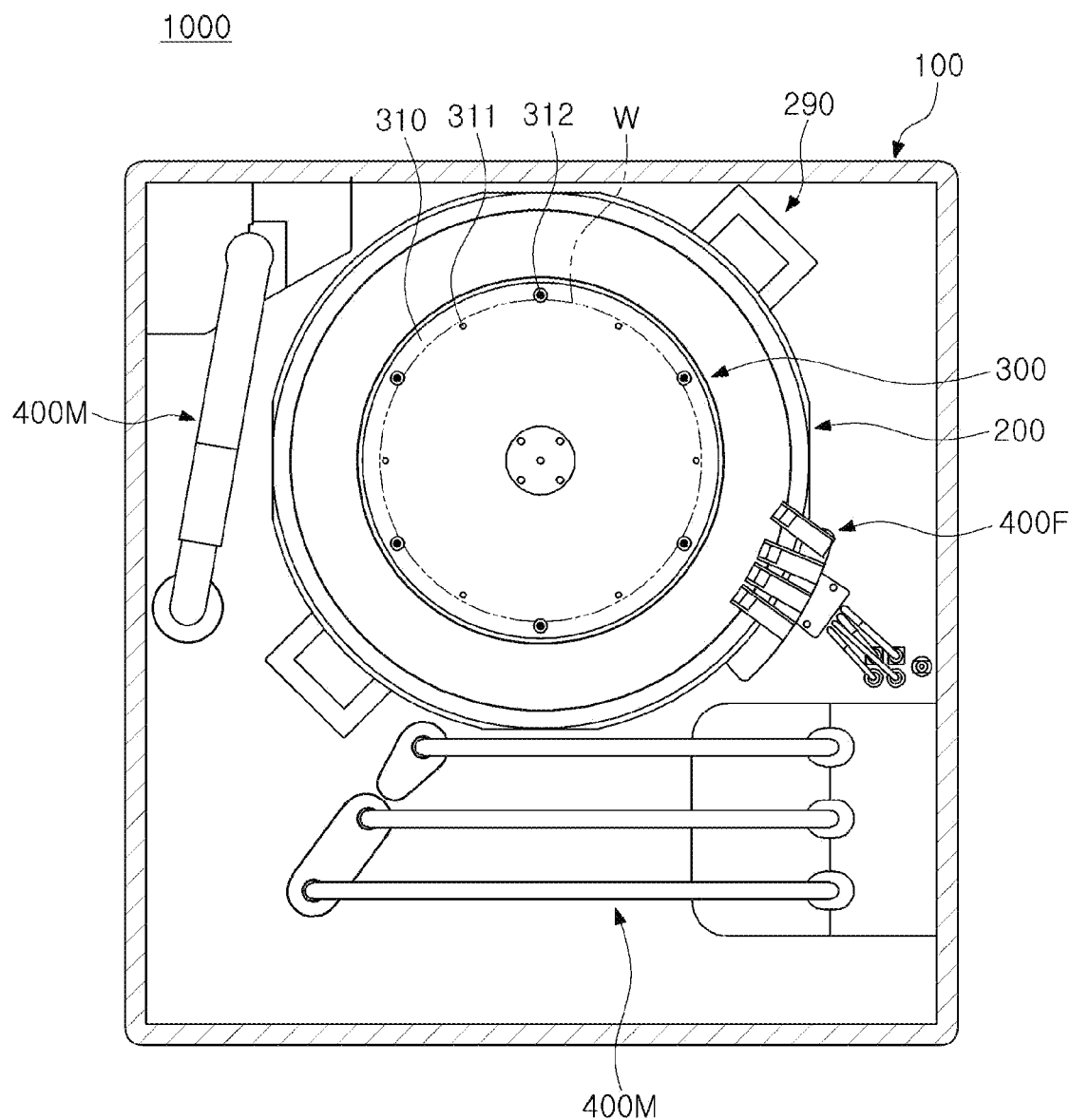
FIG. 2 is a plan view of a substrate processing apparatus according to the present disclosure.
Figure 3:
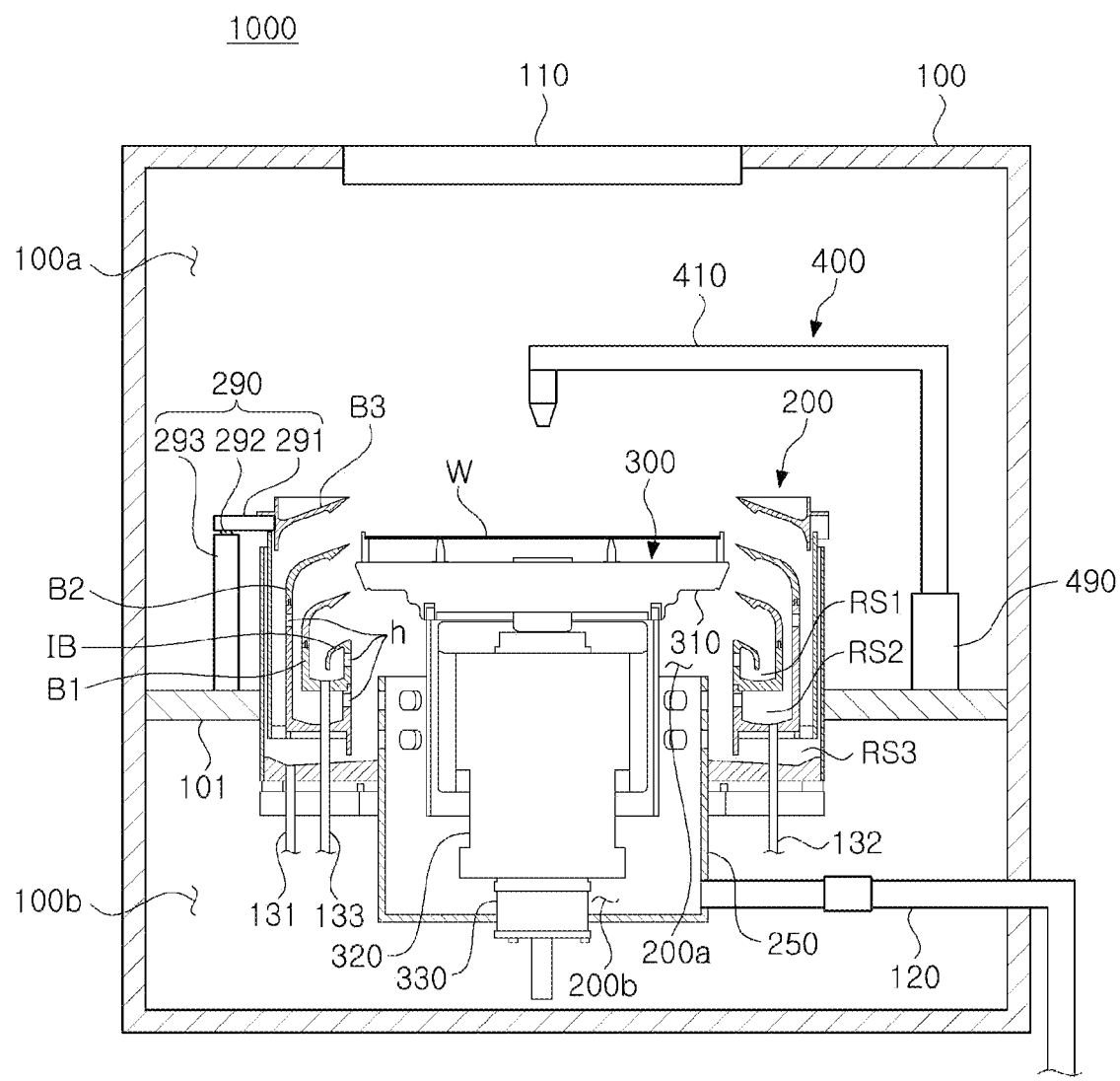
FIG. 3 is a diagram illustrating the inside of the substrate processing apparatus of FIG. 2.

FIG. 2 is a plan view of a substrate processing apparatus according to the present disclosure. FIG. 3 is a diagram illustrating the inside of the substrate processing apparatus of FIG. 2.

Referring to the drawings, a substrate processing apparatus 1000 according to the present disclosure may include a process chamber 100 performing a process on a substrate W with a liquid. In the process chamber 100, the process may be performed on the substrate W while the substrate (W) may be held horizontally. The process may be a process of etching a nitride film formed on the substrate (W). In this case, the liquid may include phosphoric acid. In addition, the process chamber 100 may be used in a process of removing foreign substances and films remaining on a surface of the substrate W using various liquids.

Specifically, the process chamber 100 may provide a sealed internal space, and a fan filter unit 110 may be installed in an upper portion of the process chamber 100. The fan filter unit 110 may generate vertical airflow within the process chamber 100. The fan filter unit 110, a filter and an air supply fan, modularized into a single unit, may filter clean air and supply the clean air to the inside of the process chamber 100. After passing through the fan filter unit 110, the clean air may be supplied to the inside of the process chamber 100 to form vertical airflow. The vertical airflow may provide uniform airflow over an upper portion of the substrate W, and may remove contaminants (fumes) generated in the process of treating, by a treatment fluid, a surface of the substrate W by discharging the contaminants together with air to recovery lines 131, 132, and 133 through a plurality of bowls 210, 220, and 230 of a processing container 200, thereby maintaining a high level of cleanliness within the processing container.

The process chamber 100 may include a process region 100a and a maintenance region 100b partitioned by a horizontal partition wall 101. A driving member 293 of a lifting unit 290 and a driving member 490 of a nozzle unit 400 may be installed on the horizontal partition wall 101. In addition, the maintenance region 100b, a space in which the recovery lines 131, 132, and 133 and an exhaust member 120, connected to the processing container 200, are positioned, may be preferably isolated from the process region 100a in which the substrate W is processed.

In addition, the substrate processing apparatus 1000 according to the present disclosure may include a processing container 200, a support unit 300, and a nozzle unit 400 in the process chamber 100. The processing container 200 may be installed within the process chamber 100, may have a cylindrical shape with an open upper portion, and may provide a processing space for processing the substrate W. An open upper surface of the processing container 200 may be provided as a path for loading and unloading the substrate W. Here, the support unit 300 may be positioned in the processing space. In this case, the support unit 300 may support the substrate W and rotate the substrate W during the process.

In addition, the processing container 200 may provide an upper space 200a in which a spin head 310 of the support unit 300 is positioned, and a lower space 200b to which an exhaust duct 250 is connected such that forced exhaust is performed. The exhaust duct 250 may be connected to the exhaust member 120 extending to the outside of the process chamber 100. In the upper space 200a of the processing container 200, an annular first bowl, second bowl, and third bowl 210, 220, and 230 for recovering and suctioning a liquid and gas scattered on the rotating substrate W may be disposed in multiple stages. The first, second, and third bowls 210, 220, and 230 may have exhaust holes h communicating with a common annular space (corresponding to the lower space of the processing container).

Here, the plurality of bowls 210, 220, and 230 may provide a plurality of recovery spaces RS1, RS2, and RS3 into which airflow containing a liquid and fume scattered from the substrate W flows. The first recovery space RS1 may be partitioned and formed by the first bowl 210, the second recovery space RS2 may be formed as a separation space between the first bowl 210 and the second bowl 220, and the third recovery space RS3 may be formed as a separation space between the second bowl 220 and the third bowl 230.

In addition, the processing container 200 may be coupled to the lifting unit 290 changing a vertical position of the processing container 200. The lifting unit 290 may linearly move the processing container 200 in a vertical direction. As the processing container 200 moves in a vertical direction, a height of the processing container 200 relative to the spin head 310 may be changed. The lifting unit 290 may have a bracket 291, a lifting shaft 292, and a driving member 293. The bracket 291 may be fixedly installed on an outer wall of the processing container 200, and the lifting shaft 292, moving in a vertical direction by the driving member 293, may be fixedly coupled to the bracket 291. When the substrate W is loaded into or unloaded from the spin head 310, the process chamber 200 may descend such that the spin head 310 protrudes upwardly from the process chamber 200.

In addition, during the process, the height of the processing container 200 may be adjusted such that a liquid flows into the bowls 210, 220, and 230 set (selected) depending on a type of liquid supplied to the substrate W. Accordingly, a relative vertical position between the processing container 200 and the substrate W may be changed. Accordingly, the processing container 200 may have different types of liquids and pollutant gases recovered for each of the recovery spaces RS1, RS2, and RS3.

The support unit 300 may be installed on the inside of the processing container 200. The support unit 300 may support the substrate W during the process, and may be rotated by a driving member 330 during the process. In addition, the support unit 300 may have a spin head 310 having a circular upper surface. The upper surface of the spin head 310 may have a plurality of support pins 311 supporting the substrate W and a plurality of chucking pins 312. The plurality of support pins 311 may be disposed on an edge portion of the upper surface of the spin head 310 to be spaced apart from each other at a regular interval in a predetermined disposing, and may be provided to protrude upwardly from the spin head 310. The support pins 311 may support a lower surface of the substrate W such that the substrate W is supported in a state of being spaced apart from the spin head 310 in an upward direction. The plurality of chucking pins 312 may be respectively disposed on the outsides of the support pins 311, and the chucking pins 312 may protrude upwardly. The plurality of chucking pins 312 may align the substrate W supported by the plurality of support pins 311 such that the substrate W is disposed on the spin head 310 in an original position. During the process, the plurality of chucking pins 312 may come into contact with a side portion of the substrate W to prevent the substrate W from deviating from the original position thereof. A support shaft 320, supporting the spin head 310, may be connected to a lower portion of the spin head 310, and the support shaft 320 may be rotated by the driving member 330, connected to a lower end thereof. In this case, the driving member 330 may be provided as a motor or the like. As the support shaft 320 is rotated by the driving member 330, the spin head 310 and the substrate W may rotate.

The nozzle unit 400 may discharge a liquid to the substrate W supported by the support unit 300. The nozzle unit 400 may be a mobile nozzle device 400M or a fixed nozzle device 400F. In this case, a plurality of mobile nozzle devices 400M may be installed on the outside of the processing container 200.

Figure 4:
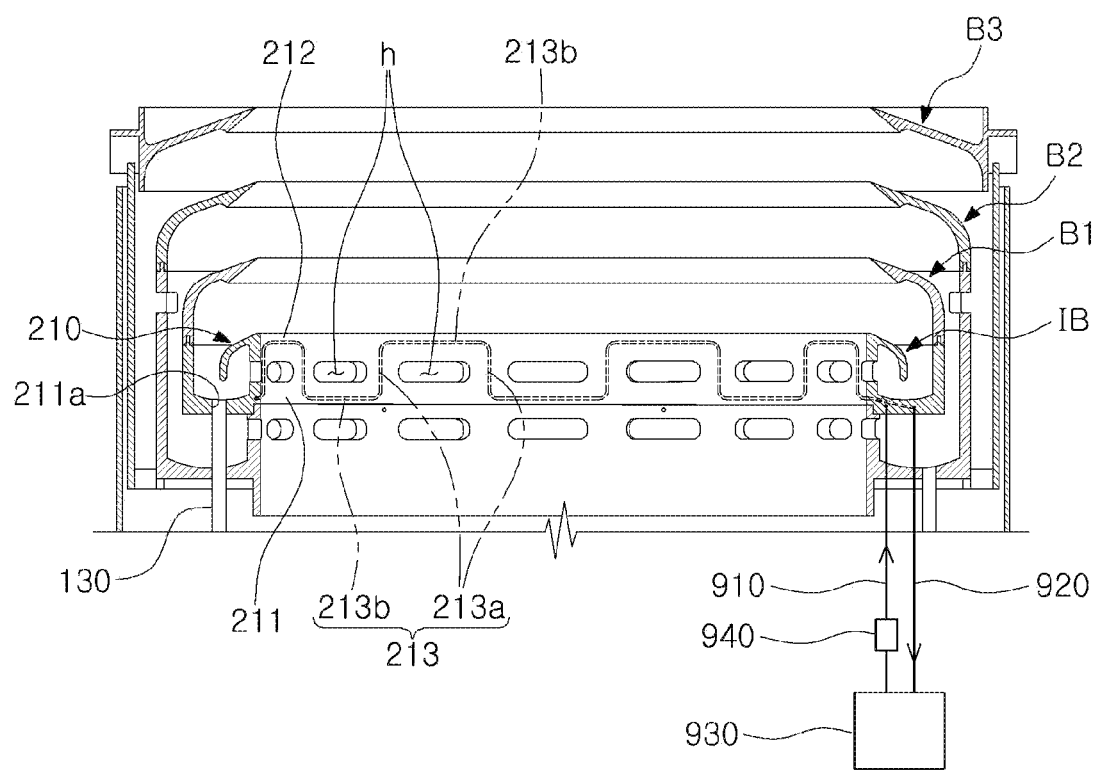
FIG. 4 is a diagram illustrating a plurality of bowls in the substrate processing apparatus of FIG. 2.
Figure 5:
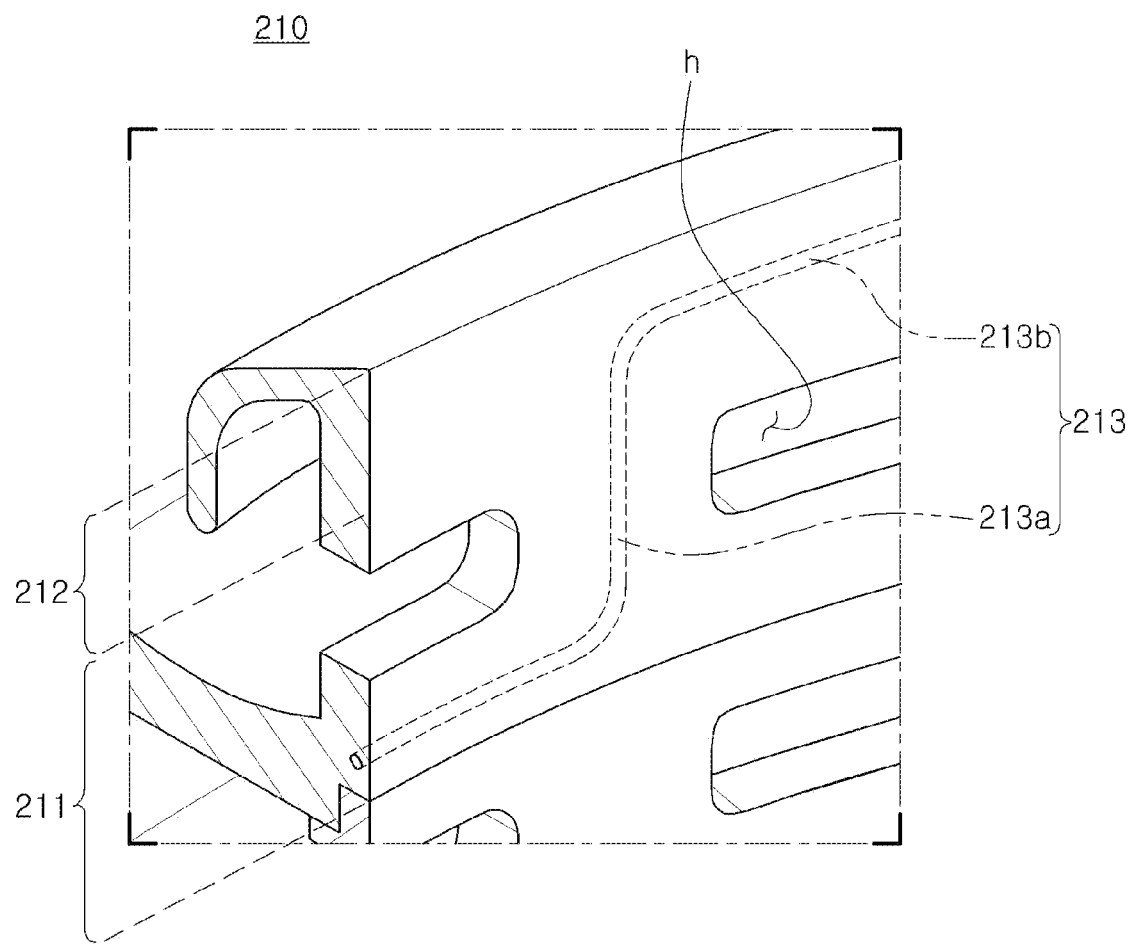
FIG. 5 is a diagram illustrating a bowl according to a first example embodiment of the present disclosure, which is an inner bowl among the plurality of bowls of FIG. 4.
Figure 6:
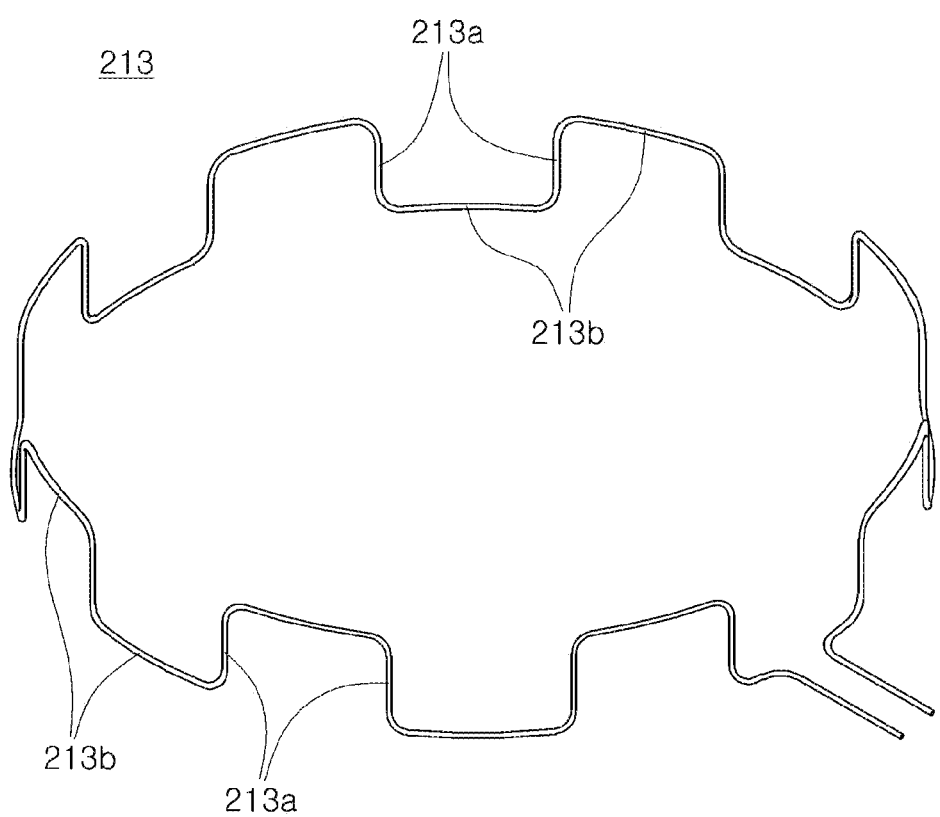
FIG. 6 is a diagram illustrating a connection frame in the bowl of FIG. 4.

FIG. 4 is a diagram illustrating a plurality of bowls in the substrate processing apparatus of FIG. 2. FIG. 5 is a diagram illustrating a bowl according to a first example embodiment of the present disclosure, among the plurality of bowls of FIG. 4. FIG. 6 is a diagram illustrating a connection frame in the bowl of FIG. 4.

Referring to the drawings, a bowl 210 according to a first example embodiment of the present disclosure may be formed to have an integral structure.

Specifically, the bowl 210 may include a body portion 211 as a lower portion and a guide portion 212 as an upper portion.

The body portion 211 may have a cylindrical structure, and a support unit (300 in FIG. 3), supporting a substrate (W in FIG. 3), may be disposed on the inside of the body portion 211. The body portion 211 may have a recovery hole 211a formed on an upper portion thereof. In this case, the recovery line 130, recovering a liquid, may be connected to the recovery hole 211a.

Figure 8:
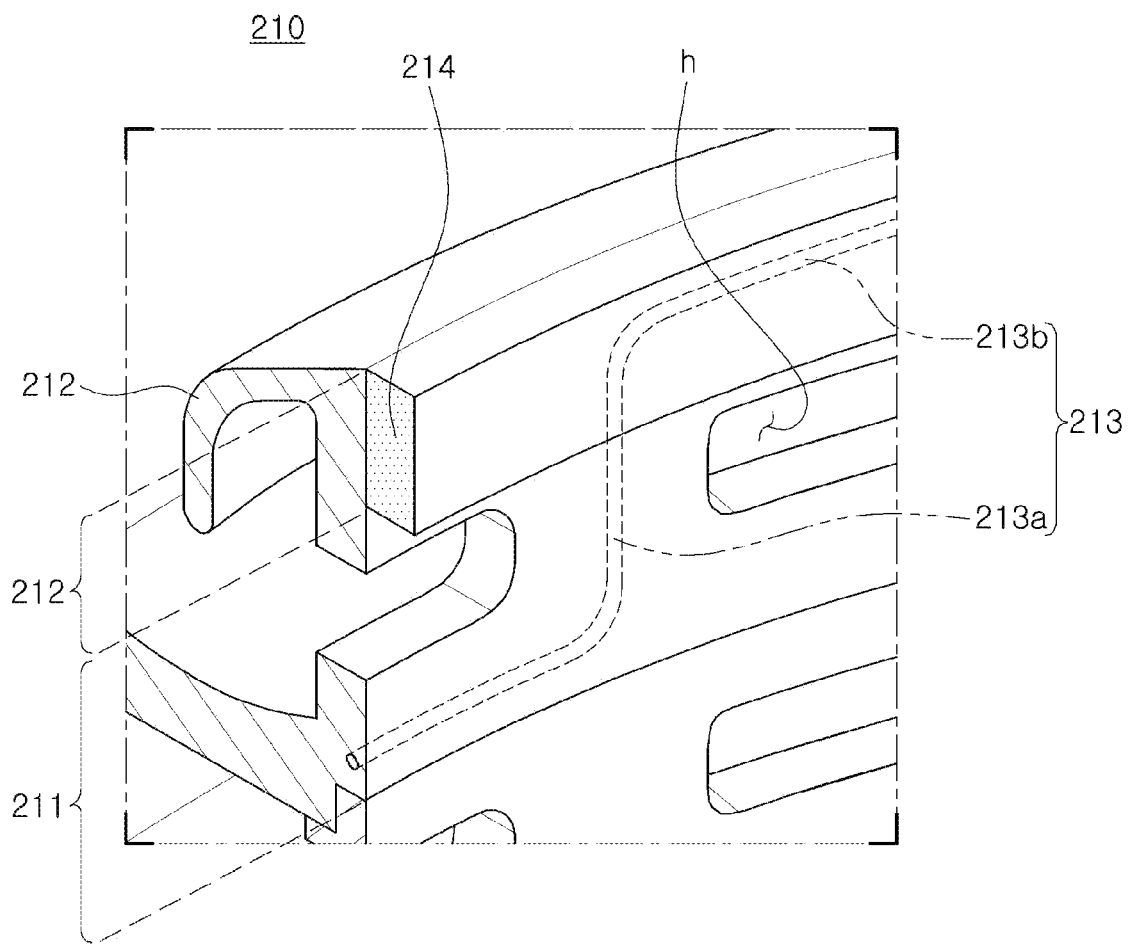
FIG. 8 is a diagram illustrating a bowl according to a third example embodiment of the present disclosure.
Figure 9:
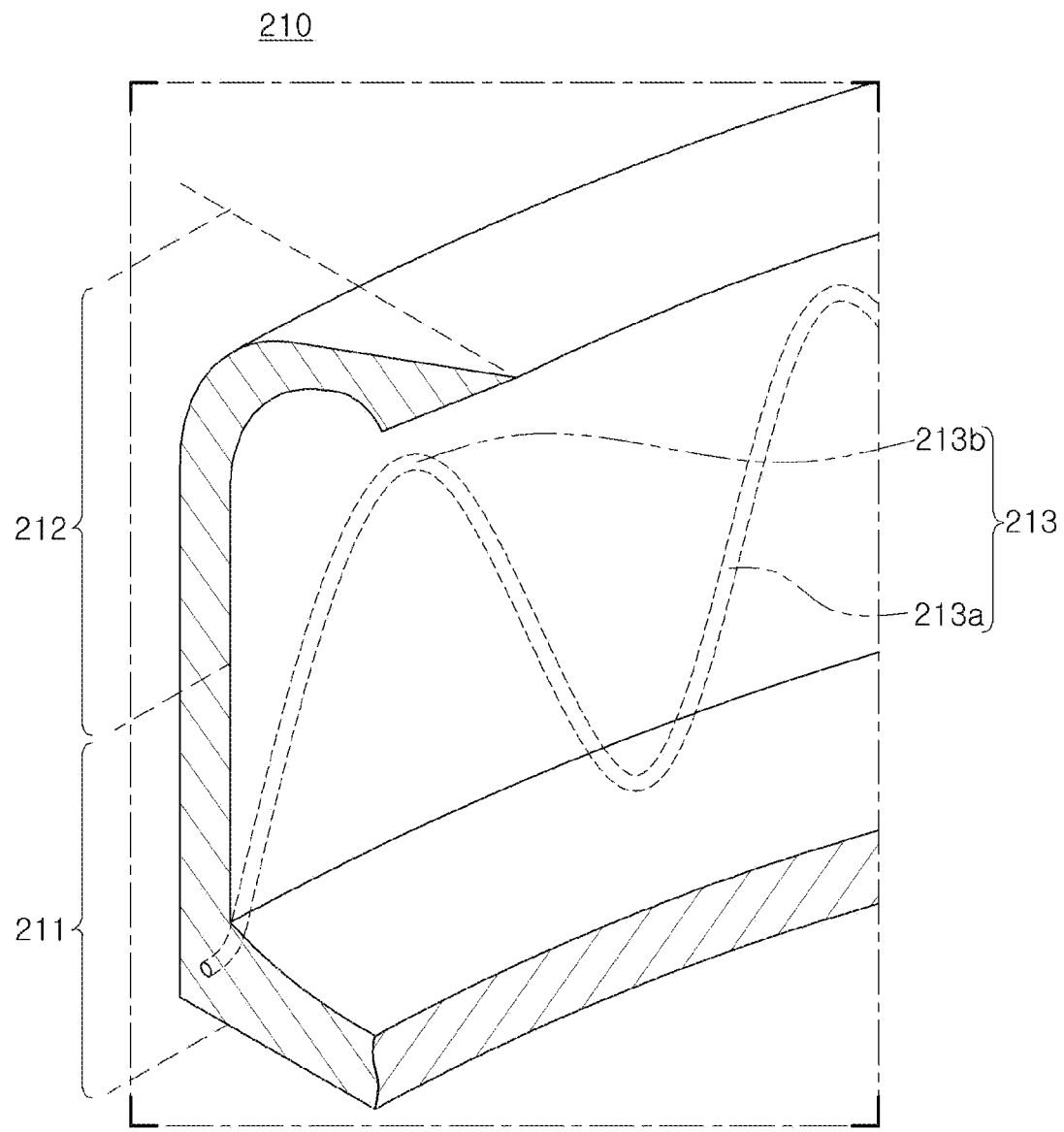
FIG. 9 is a diagram illustrating a first bowl, among the plurality of bowls of FIG. 4, to which the present disclosure is applied.

In addition, the guide portion 212 may extend upwardly from the upper portion of the body portion 211, and then may extend in a lateral direction. That is, the guide portion 212 may have a structure erected upwardly from an upper end portion of the body portion 211. In addition, the guide portion 212 may have a bent or curved structure to be inclined in a lateral direction. The guide portion 212 may have a structure extending in a lateral direction, and thus may serve to guide a liquid, scattering from a substrate, to the body portion 211 to which the recovery line 130 is connected, when the liquid is recovered by the bowl 210. Specifically, when the bowl 210 is a first bowl (B1 in FIG. 3), a second bowl (B2 in FIG. 3), or a third bowl (B3 in FIG. 3), the guide portion 212 may have a structure extending upwardly from the body portion 211 and then being inclined upwardly in an inner lateral direction. When the bowl 210 is an inner bowl (IB in FIG. 3) disposed on the outside of the first bowl (B1 in FIG. 3), the guide portion 212 may have a structure extending upwardly from the body portion 211 and being inclined downwardly in an outer lateral direction. FIGS. 4 to 8 illustrate a structure of the bowl 210 according to the present disclosure applied to the inner bowl (IB in FIG. 3). In addition, when the structure of the bowl 210 according to the present disclosure is applied to the first bowl (B1 in FIG. 3), the first bowl may be illustrated, as illustrated in FIG. 9.

The body portion 211 and the guide portion 212 according to the present disclosure may have a structure integrally formed to be connected to each other.

While a bowl (10 in FIG. 1) according to the related art has an assembly structure in which a body portion (11 in FIG. 1) and a guide portion (212 in FIG. 1) are assembled together, the bowl 210 according to the present disclosure may be manufactured to have an integral structure rather than an assembly structure in which the body portion 211 and the guide portion 212 are assembled together.

As an example, the body portion 211 and the guide portion 212 according to the present disclosure may be manufactured to have an integral structure by injection molding. Specifically, the body portion 211 and the guide portion 212 may be molded by insert injection in which a connection frame 213 to be described below is inserted, and may be formed to have an integrated structure.

The body portion 211 and the guide portion 212, having an integral structure, may be firmly fixed by the connection frame 213.

Specifically, the connection frame 213 may be installed across the inside of the body portion 211 and the inside of the guide portion 212.

That is, portions of the connection frame 213 may be disposed on the inside of the body portion 211 and remaining portions may be disposed on the inside of the guide portion 212.

Accordingly, the body portion 211 and the guide portion 212 may be integrally formed while being fixed by the connection frame 213, such that the bowl 210 according to the present disclosure may prevent the guide portion 212 from being separated from the body portion 211 while being thermally deformed by a high-temperature liquid.

Specifically, the connection frame 213 may include a first portion 213a and a second portion 213b.

The first portion 213a may be disposed across the body portion 211 and the guide portion 212. The first portion 213a may be disposed across the inside of the body portion 211 and the inside of the guide portion 212. The first portion 213a may be formed in a longitudinal direction to be disposed across the lower body portion 211 and the upper guide portion 212.

In addition, a plurality of first portions 213a may be disposed to be spaced apart from each other in a circumferential direction of the cylindrical bowl 210. The first portions 213a may serve to firmly fix the body portion 211 and the guide portion 212 to each other.

More specifically, a plurality of exhaust holes H may be formed in the body portion 211 to be spaced apart from each other. The exhaust holes H may be portions for exhausting gas recovered along with the liquid by the bowl 210, and the first portion 213a may be disposed between the plurality of exhaust holes H so as not to interfere with the exhaust holes.

In addition, a plurality of second portions 213b may be disposed to connect the plurality of first portions 213a to each other. A portion of the plurality of second portions 213b may be disposed in the body portion 211, and a remaining portion of the plurality of second portions 213b may be disposed in the guide portion 212.

More specifically, a portion of the second portions 213b may be disposed on the inside of the body portion 211 and a remaining portion of the plurality of second portions 213b may be disposed on the inside of the guide portion 212. In this case, a portion of the plurality of second portions 213b may connect one ends of the plurality of first portions 213a to each other, and a remaining portion of the plurality of second portions 213b may connect the other ends of the plurality of first portions 213a to each other.

Thus, the connection frame 213 may have a structure in which the first portion 213a and the second portion 213b are alternately connected to each other, such that an overall portion of the body portion 211 and the guide portion 212 may be firmly fixed.

In addition, the above-described connection frame 213 may be formed to have a zigzag pattern. As illustrated in FIGS. 4 to 8, the connection frame 213 may be formed to have a shape in which the first portion 213a is vertically disposed and the second portion 213b is horizontally disposed. Alternatively, as illustrated in FIG. 9, the connection frame 213 may be formed to have a wave-like shape in which the first portion 213a is disposed to be inclined and the second portion 213b is disposed to be curved. In addition, the connection frame 213 may be formed to have various zigzag patterns.

In addition, the connection frame 213 may have a pipe structure in which a refrigerant flows. That is, the connection frame 213 may be in the form of a pipe having a route for the refrigerant to flow therein. In other words, the connection frame 213 may be used as a refrigerant pipe.

Thus, the connection frame 213 according to the present disclosure, having a pipe structure in which a refrigerant flows, may firmly fix the body portion 211 and the guide portion 212, and may cool the body portion 211 and the guide portion 212. The body portion 211 and guide portion 212 may be thermally deformed due to a high-temperature liquid recovered after being discharged to the substrate. The connection frame 213 may prevent the body portion 211 and guide portion 212 from being thermally deformed by cooling the body portion 211 and guide portion 212.

The connection frame 213 may have one end connected to a refrigerant supply pipe 910 and the other end connected to a refrigerant recovery pipe 920, as illustrated in FIG. 4. The refrigerant supply pipe 910 and the refrigerant recovery pipe 920 may be connected to each other by a circulation pump 930, and a heat exchanger 940 may be installed in the refrigerant supply pipe 910. Accordingly, the connection frame 213 may continue to stably perform cooling on the body portion 211 and the guide portion 212 during a substrate process.

In addition, the connection frame 213 may be formed of a metal material. The connection frame 213, disposed on the inside of each of the body portion 211 and the guide portion 212 formed of a resin material processed by injection molding, may be formed of a metal material, thereby firmly fixing the body portion 211 and the guide portion 212.

Figure 7:
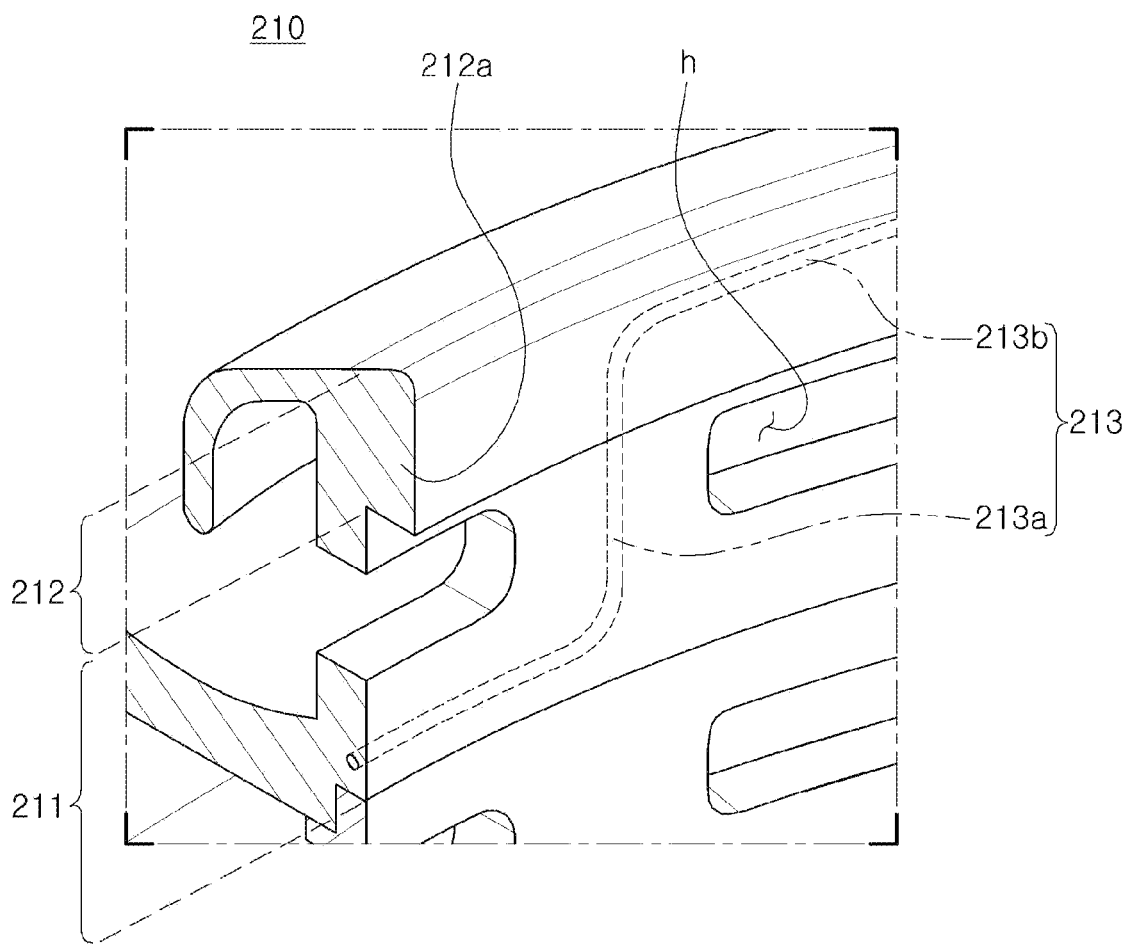
FIG. 7 is a diagram illustrating a bowl according to a second example embodiment of the present disclosure.

FIG. 7 is a diagram illustrating a bowl according to a second example embodiment of the present disclosure. FIG. 8 is a diagram illustrating a bowl according to a third example embodiment of the present disclosure.

The guide portion 212 may have an extension 212a protruding inwardly to be thicker than the body portion 211, as illustrated in FIG. 7, or may have a ring-shaped reinforcing member 214, as illustrated in FIG. 8.

In the process of a high-temperature liquid, such as a high-temperature SPM, being discharged to the substrate and then being recovered by the bowl 210, thermal deformation of the guide portion 212 with which a high-temperature liquid first comes into contact may occur more easily than the body portion 211.

Accordingly, in the present disclosure, the guide portion 212 may have the extension 212a protruding inwardly such that the guide portion 212 is thicker than the body portion 211 in terms of thickness as in the second example embodiment illustrated in FIG. 7, or the ring-shaped reinforcing member 214 may installed on an inner circumferential surface of the guide portion 212 as in the third example embodiment illustrated in FIG. 8, thereby preventing thermal deformation of the guide portion 212. For reference, components not described among the components illustrated in FIGS. 7 and 8 may be the same as components having the same reference numerals in FIGS. 4 to 6, and thus a detailed description thereof will be omitted.

Figure 10:
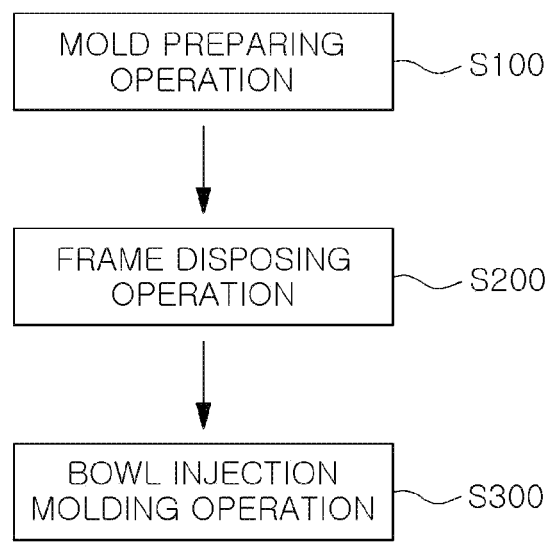
FIG. 10 is a flowchart illustrating a method of manufacturing a bowl according to an example embodiment of the present disclosure.

FIG. 10 is a flowchart illustrating a method of manufacturing a bowl according to an example embodiment of the present disclosure.

Referring to FIGS. 4 and 10, the method of manufacturing a bowl according to the present disclosure may include a mold preparing operation (S100), a frame disposing operation (S200), and a bowl injection molding operation (S300).

First, the mold preparing operation (S100) may be an operation of preparing a mold (not illustrated) formed such that a first space and a second space are connected to each other. That is, the first space and the second space may communicate with each other. The first space may be a space corresponding to the body portion 211 having a cylindrical structure, and the second space may be a space corresponding to the guide portion 212 having a cylindrical structure.

Subsequently, the frame disposing operation (S200) may be an operation of disposing the connection frame 213 across the first space and the second space. That is, in the frame disposing operation (S200), the connection frame 213 may be moved into the mold, such that the connection frame 213 may be disposed across the first space and the second space.

Specifically, in the frame disposing operation (S200), each of the plurality of first portions 213a of the connection frame 213 may be disposed across the first space and the second space. A portion of the plurality of second portions 213b of the connection frame 213, connecting the plurality of first portions 213a to each other, may be disposed in the first space, and a remaining portion of the plurality of second portions 213b may be disposed in the second space. Here, the first portion 213a and the second portion 213b may be alternately connected to each other.

In addition, in the frame disposing operation (S200), a pipe in which a refrigerant is flowable may be used as the connection frame 213. That is, a refrigerant pipe may be used as the connection frame 213.

Finally, the bowl injection molding operation (S300) may be an operation of molding the body portion 211 and the guide portion 212 by injecting a molten material into the first space and the second space. As the connection frame 213 is disposed across the first space and the second space by the frame disposing operation (S200), the body portion 211 and the guide portion 212 may be integrally molded while being fixed to the connection frame 213 by the bowl injection molding operation (S300).

While example embodiments have been illustrated and described above, it will be apparent to those skilled in the art that modifications and variations could be made without departing from the scope of the present disclosure as defined by the appended claims.

What is claimed is:

1. A bowl comprising:
a body portion having a recovery hole to which a recovery line is connected;
a guide portion extending upwardly from an upper portion of the body portion and then extending in a lateral direction; and
a connection frame installed across the inside of the body portion and the inside of the guide portion,
wherein the connection frame includes a zigzag pattern with a plurality of first portions being vertically disposed and a plurality of second portions being horizontally disposed.

2. The bowl of claim 1, wherein
the connection frame includes:
the plurality of first portions disposed across the body portion and the guide portion, the plurality of first portions disposed to be spaced apart from each other; and
the plurality of second portions connecting the plurality of first portions to each other, and
a portion of the plurality of second portions is disposed in the body portion, and a remaining portion of the plurality of second portions is disposed in the guide portion.

3. The bowl of claim 2, wherein
a portion of the plurality of second portions connect one ends of the plurality of first portions to each other, and
a remaining portion of the plurality of second portions connect the other ends of the plurality of first portions to each other.

4. The bowl of claim 2, wherein
a plurality of exhaust holes are formed in the body portion to be spaced apart from each other, and
the first portion is disposed between the plurality of exhaust holes.

5. The bowl of claim 1, wherein the connection frame has a pipe structure in which a refrigerant flows.

6. The bowl of claim 5, wherein the connection frame has one end connected to a refrigerant supply pipe and the other end connected to a refrigerant recovery pipe.

7. The bowl of claim 1, wherein the body portion and the guide portion are integrally formed.

8. The bowl of claim 1, wherein the guide portion has an extension protruding inwardly to be thicker than the body portion.

9. The bowl of claim 1, wherein a ring-shaped reinforcing member is installed on an inner circumferential surface of the guide portion.

10. A substrate processing apparatus comprising:
a process chamber;
a processing container installed within the process chamber, the processing container having a processing space for processing a substrate;
a support configured to support the substrate in the processing space; and
a nozzle configured to discharge a liquid to the substrate,
wherein the processing container includes a plurality of bowls disposed on a circumference of the support, and
at least one of the plurality of bowls includes:
a body portion having a cylindrical structure, the body portion having a recovery hole to which a recovery line is connected;
a guide portion extending upwardly from an upper portion of the body portion and then extending in a lateral direction; and
a connection frame installed across the inside of the body portion and the inside of the guide portion,
wherein the connection frame includes a zigzag pattern with a plurality of first portions being vertically disposed and a plurality of second portions being horizontally disposed.

11. The substrate processing apparatus of claim 10, wherein the connection frame includes:
the plurality of first portions disposed across the body portion and the guide portion, the plurality of first portions disposed to be spaced apart from each other; and
the plurality of second portions connecting the plurality of first portions to each other, and
a portion of the plurality of second portions is disposed in the body portion, and a remaining portion of the plurality of second portions is disposed in the guide portion.

12. The substrate processing apparatus of claim 11, wherein
a portion of the plurality of second portions connect one ends of the plurality of first portions to each other, and
a remaining portion of the plurality of second portions connect the other ends of the plurality of first portions to each other.

13. The substrate processing apparatus of claim 11, wherein
a plurality of exhaust holes are formed to be spaced apart from each other in the body portion, and
the first portion is disposed between the plurality of exhaust holes.

14. The substrate processing apparatus of claim 10, wherein the connection frame has a pipe structure in which a refrigerant flows.

15. The substrate processing apparatus of claim 14, wherein the connection frame has one end connected to a refrigerant supply pipe and the other end connected to a refrigerant recovery pipe.

16. The substrate processing apparatus of claim 15, wherein
the refrigerant supply pipe and the refrigerant recovery pipe are connected to each other by a circulation pump, and
a heat exchanger is installed in the refrigerant supply pipe.

17. The substrate processing apparatus of claim 10, wherein the body portion and the guide portion are integrally formed.

18. A method of manufacturing a bowl, the method comprising:
preparing a mold formed such that a first space and a second space, respectively corresponding to a body portion and a guide portion connected to one end of the body portion, are connected to each other;
disposing a connection frame across the first space and the second space; and
injecting a molten material into the first space and the second space and integrally molding the body portion and the guide portion while fixing the body portion and the guide portion to the connection frame,
wherein the connection frame includes a zigzag pattern with a plurality of first portions being vertically disposed and a plurality of second portions being horizontally disposed.

19. The method of claim 18, wherein in the disposing, each of the plurality of first portions of the connection frame is disposed across the first space and the second space, and a portion of the plurality of second portions of the connection frame, connecting the plurality of first portions to each other, is disposed in the first space, and a remaining portion of the plurality of second portion is disposed in the second space, and
the first portion and the second portion are disposed to be alternately connected to each other.

20. The method of claim 18, wherein in the disposing, a pipe in which a refrigerant is flowable is used as the connection frame.

* * * * *

UNITED STATES PATENT AND TRADEMARK OFFICE
CERTIFICATE OF CORRECTION

| | | |
|---|---|---|
| PATENT NO. | : 12,509,779 B2 | Page 1 of 1 |
| APPLICATION NO. | : 18/302839 | |
| DATED | : December 30, 2025 | |
| INVENTOR(S) | : Sang Hu Han | |

It is certified that error appears in the above-identified patent and that said Letters Patent is hereby corrected as shown below:

On the Title Page

Item (54) and in the Specification, Column 1, Lines 1-3 should read:
BOWL, SUBSTRATE PROCESSING APPARATUS, AND METHOD OF MANUFACTURING BOWL Signed and Sealed this
Tenth Day of February, 2026

John A. Squires
*Director of the United States Patent and Trademark Office*